US012684822B2

(12) United States Patent
Hsu et al.

(10) Patent No.: US 12,684,822 B2
(45) Date of Patent: Jul. 14, 2026

(54) SEMICONDUCTOR STRUCTURE AND METHOD OF FORMING THE SAME

(71) Applicant: Winbond Electronics Corp., Taichung City (TW)

(72) Inventors: Po-Yen Hsu, Taichung City (TW); Bo-Lun Wu, Taichung City (TW); Tse-Mian Kuo, New Taipei City (TW)

(73) Assignee: WINBOND ELECTRONICS CORP., Taichung City (TW)

( * ) Notice: Subject to any disclaimer, the term of this patent is extended or adjusted under 35 U.S.C. 154(b) by 364 days.

(21) Appl. No.: 18/472,286

(22) Filed: Sep. 22, 2023

(65) Prior Publication Data

US 2024/0387666 A1 Nov. 21, 2024

(30) Foreign Application Priority Data

May 18, 2023 (TW) .................................. 112118486

(51) Int. Cl.
| | |
|---|---|
| *H10D 30/68* | (2025.01) |
| *H10B 41/30* | (2023.01) |
| *H10W 20/00* | (2026.01) |

(52) U.S. Cl.
CPC ......... *H10D 30/6891* (2025.01); *H10B 41/30* (2023.02); *H10W 20/075* (2026.01)

(58) Field of Classification Search
None
See application file for complete search history.

(56) References Cited

U.S. PATENT DOCUMENTS

| | | | | |
|---|---|---|---|---|
| 8,264,030 B2 | 9/2012 | Kwon | | |
| 2002/0142546 A1* | 10/2002 | Kouznetsov | ........... | H10D 8/812 |
| | | | | 438/257 |
| 2010/0295117 A1* | 11/2010 | Wei | ........................ | H10B 43/30 |
| | | | | 257/E21.409 |
| 2016/0181265 A1* | 6/2016 | Regnier | ............. | H10D 30/0411 |
| | | | | 438/258 |
| 2016/0260815 A1* | 9/2016 | Ohba | ................. | H10D 30/6891 |
| 2020/0251480 A1* | 8/2020 | Jang | ........................ | H10D 30/68 |
| 2022/0037345 A1* | 2/2022 | Tsai | ........................ | H10B 41/42 |
| 2022/0093623 A1* | 3/2022 | Wang | ..................... | H10B 41/42 |

* cited by examiner

*Primary Examiner* — Alexander G Ghyka
(74) *Attorney, Agent, or Firm* — MUNCY, GEISSLER, OLDS & LOWE, P.C.

(57) ABSTRACT

A semiconductor structure and a method of forming the same are provided. The semiconductor structure includes a substrate, a floating gate, a dielectric stack, a control gate, and a protective layer. The substrate includes an active region and a peripheral region. The floating gate is disposed on the substrate. The dielectric stack is disposed on the floating gate. The control gate is disposed on the dielectric stack. The protective layer is disposed on the control gate. The protective layer located in the active region has a stepped portion.

20 Claims, 6 Drawing Sheets

SEMICONDUCTOR STRUCTURE AND METHOD OF FORMING THE SAME

CROSS REFERENCE TO RELATED APPLICATIONS

This application claims priority of Taiwan Patent Application No. 112118486, filed on May 18, 2023, the entirety of which is incorporated by reference herein.

BACKGROUND OF THE INVENTION

Field of the Invention

The present disclosure relates to a semiconductor structure and a method of forming the same, and, in particular, to a semiconductor structure including a protective layer with a stepped portion and a method of forming the same.

Description of the Related Art

With the trend of miniaturization of semiconductor devices, the size of non-volatile memory devices is also continuously being reduced to increase density and improve performance. Non-volatile memory devices typically include a floating gate for trapping and storing electrons and a control gate for controlling the potential. However, the continuously shrinking size causes problems such as leakage current between adjacent components, which can adversely affect the performance of the memory device.

Although existing semiconductor structures and methods of forming the same have gradually met their intended uses, they have not yet met requirements in all respects. Therefore, there are still some problems to be overcome.

BRIEF SUMMARY OF THE INVENTION

In view of the above problems, by disposing a protective layer with a stepped portion, the present disclosure reduces the damage caused to other components during the etching process that forms the semiconductor structure. This improves the electrical properties, the reliability, and the process margin (the process window) of the semiconductor structure and the method of forming the same.

In some embodiments of the present disclosure, a semiconductor structure is provided. The semiconductor structure includes a substrate, a floating gate, a dielectric stack, a control gate, and a protective layer. The substrate includes an active region and a peripheral region. The floating gate is disposed on the substrate. The dielectric stack is disposed on the floating gate. The control gate is disposed on the dielectric stack. The protective layer is disposed on the control gate. The protective layer located in the active region has a stepped portion.

In some embodiments of the present disclosure, a method of forming a semiconductor structure is provided. The method includes forming a floating gate on a substrate, wherein the substrate includes an active region and a peripheral region. A dielectric stack is formed on the floating gate. A control gate is formed on the dielectric stack. A protective layer is formed on the control gate. A capping layer is formed on the protective layer. An etching process is performed by using the capping layer as an etching mask, so that the protective layer located in the active region has a stepped portion.

The semiconductor structure and the method of forming the same of the present disclosure may be applied in various types of semiconductor device. In order to make the features and advantages of some embodiments of the present disclosure more understand, some embodiments of the present disclosure are listed below in conjunction with the accompanying drawings, and are described in detail as follows.

DETAILED DESCRIPTION OF THE INVENTION

Figure 1:
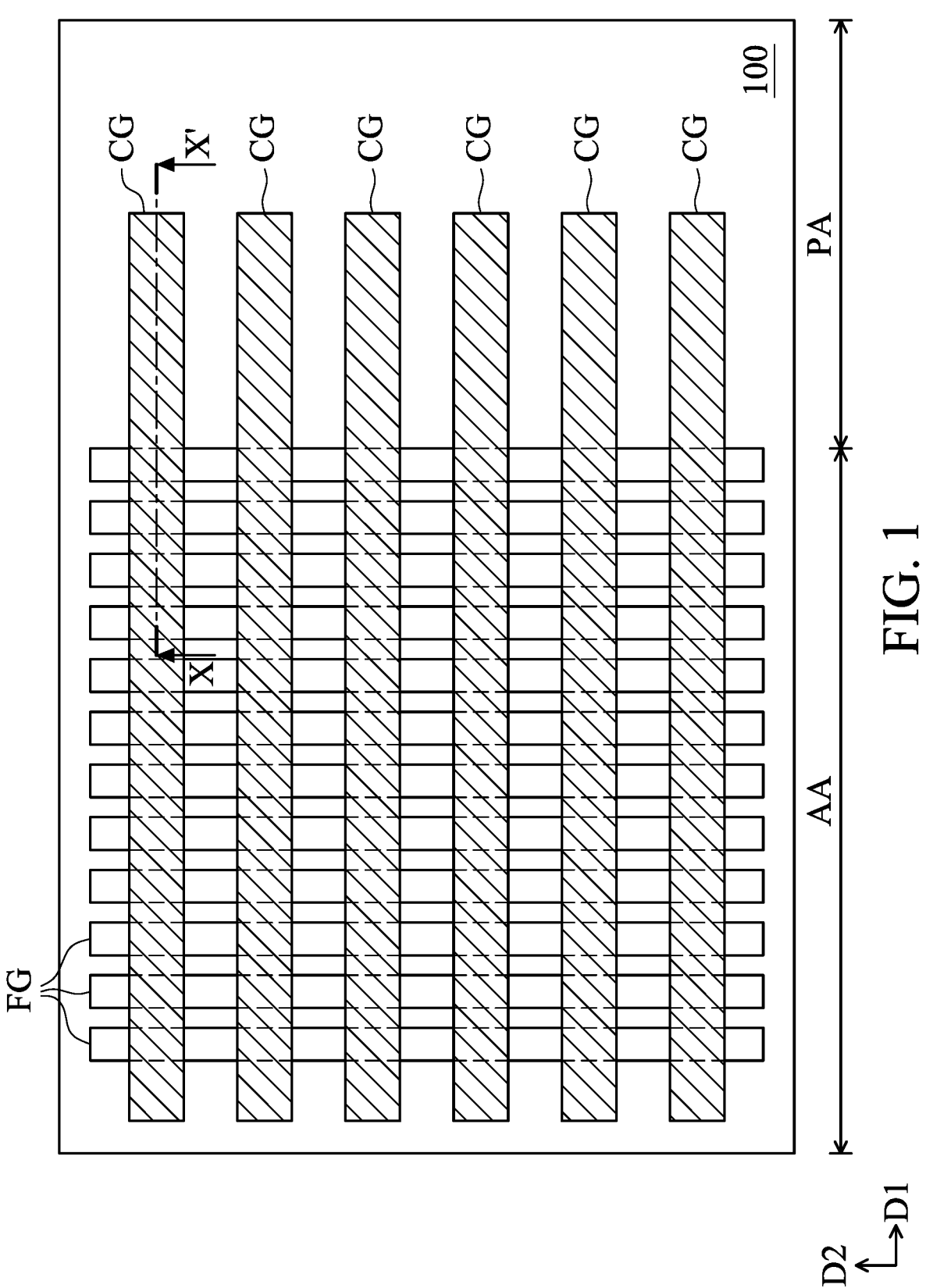
FIG. 1 is a schematic top view illustrating a layout of a semiconductor structure according to some embodiments of the present disclosure.

Referring to FIG. 1, it is a schematic top view illustrating the layout of a semiconductor structure according to some embodiments of the present disclosure. As shown in FIG. 1, for convenience of description, only the substrate 100, the floating gate FG, and the control gate CG are shown, and other components are omitted. In some embodiments, other components may be disposed in the semiconductor structure.

In some embodiments, the substrate 100 may be provided. In some embodiments, the floating gate FG may be disposed on the substrate 100 and disposed in the active region AA. In some embodiments, a plurality of floating gates FG is provided. Each of the plurality of floating gates FG may be separated from each other in the first direction D1, and each of the plurality of floating gates FG may extend along the second direction D2, respectively. In some embodiments, a boundary of the floating gate FG closest to the peripheral region PA among the plurality of floating gates FG may substantially serve as a boundary between the active region AA and the peripheral region PA. For example, as shown in FIG. 1, a right boundary of the rightmost floating gate FG may be substantially a common boundary of the active region AA and the peripheral region PA.

As shown in FIG. 1, in some embodiments, a control gate CG may be disposed on the floating gate FG. In some embodiments, a plurality of control gates CG is provided. Each of the plurality of control gates CG may be separated from each other in the second direction D2, and each of the plurality of control gates CG may extend along the first direction D1, respectively. In some embodiments, the control gate CG may be disposed in both the active region AA and the peripheral region PA. That is, the control gate CG may extend from the active region AA into the peripheral region PA.

Figures 2, 3:
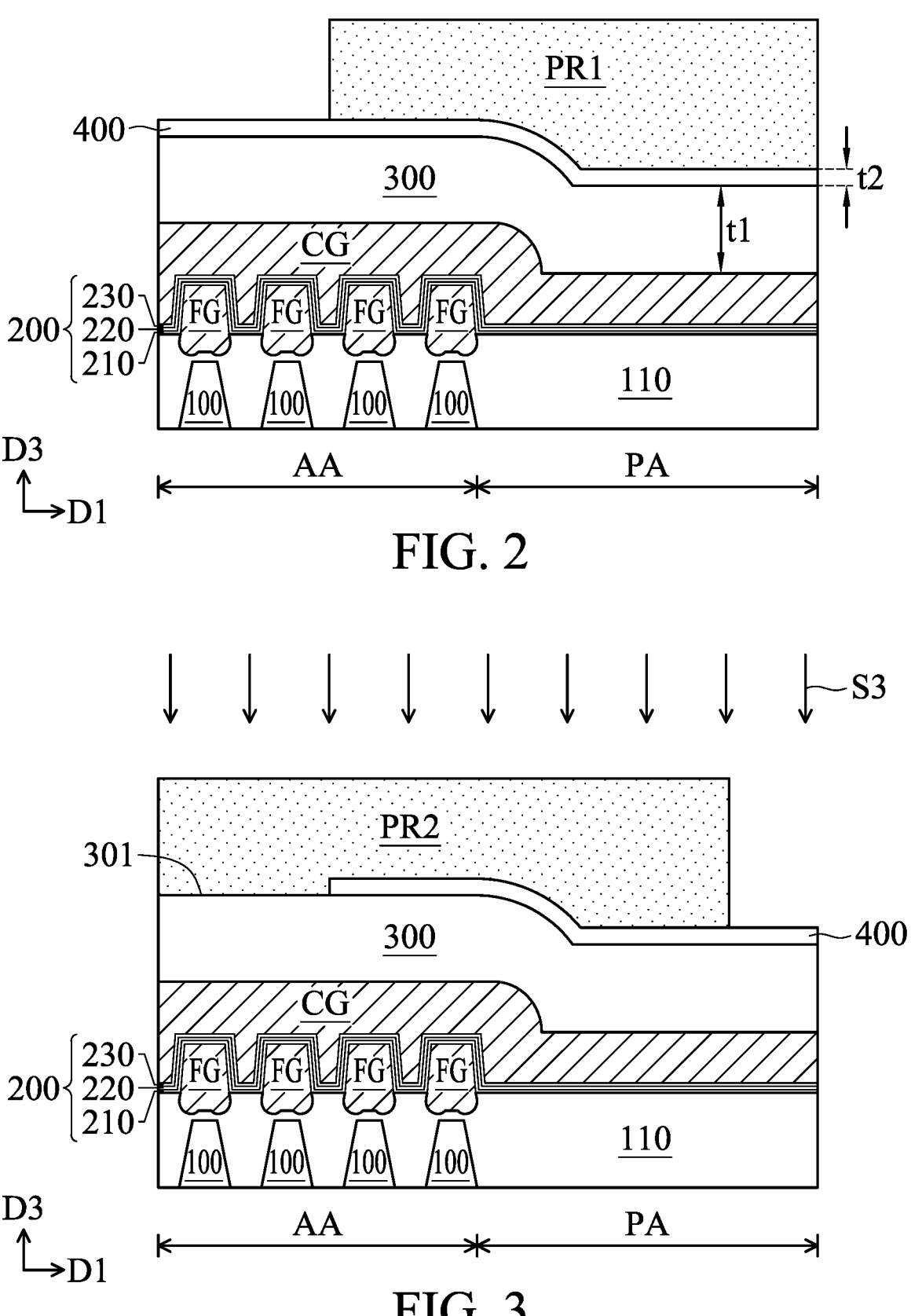
FIG. 2 to FIG. 9 are respectively schematic cross-sectional views illustrating the formation of semiconductor structure in various stages according to some embodiments of the present disclosure.

Referring to FIG. 2, it is a schematic cross-sectional view illustrating the formation of semiconductor structure in various stages according to some embodiments of the present disclosure. Wherein, FIG. 2 is the schematic cross-sectional view taken along the section line X-X' in FIG. 1. In other words, FIG. 2 is the schematic cross-sectional view taken along an extending direction of the control gate CG (i.e., the first direction D1). In addition, FIG. 3 to FIG. 10 described later are schematic cross-sectional views taken along the section line X-X' in FIG. 1.

As shown in FIG. 2, in some embodiments, an isolation structure 110 may be formed in the substrate 100 to provide electrical isolation. In some embodiments, the isolation structure 110 may be formed in the active region AA, so that the isolation structure 110 provides electrical isolation for components subsequently disposed in the active region AA.

As shown in FIG. 2, in some embodiments, the floating gate FG may be disposed on the substrate 100. In some embodiments, the floating gate FG may be formed in the active region AA. In some embodiments, the floating gates FG may be separated from each other by the isolation structure 110. In some embodiments, the bottom surface of the floating gate FG may be U-shaped, W-shaped, wavy, or another suitable shape, but the disclosure is not limited thereto. In some embodiments, the floating gate FG may protrude from the isolation structure 110. In other words, the top surface of the floating gate FG may be higher than the top surface of the isolation structure 110. In some embodiments, the floating gate FG may include polycrystalline silicon, amorphous silicon, metal, metal nitride, conductive metal oxide, a combination thereof, or another suitable material, but the present disclosure is not limited thereto. For example, the floating gate FG may be polycrystalline silicon.

Next, as shown in FIG. 2, in some embodiments, a dielectric stack 200 may be disposed on the floating gate FG. In some embodiments, the dielectric stack 200 is conformally disposed on the floating gate FG. In some embodiments, the dielectric stack 200 may be disposed in the active region AA and the peripheral region PA. In some embodiments, the dielectric stack 200 on the floating gate FG is further away from the substrate 100 than the dielectric stack 200 on the isolation structure 110.

In some embodiments, the dielectric stack 200 may include a plurality of sub-layers according to the electrical requirements of the semiconductor structure. In some embodiments, the dielectric stack 200 may include a first sub-layer 210, a second sub-layer 220, and a third sub-layer 230 disposed in sequence. In some embodiments, the first sub-layer 210 may be disposed on the floating gate FG and the isolation structure 110, the second sub-layer 220 may be disposed on the first sub-layer 210, and the third sub-layer 230 may be disposed on the second sub-layer 220. In some embodiments, the dielectric stack 200 may include oxides, nitrides, oxynitrides, other suitable dielectric materials, like, or a combination thereof, but the present disclosure is not limited thereto. For example, the first sub-layer 210 and the third sub-layer 230 may be silicon oxide, and the second sub-layer 220 may be silicon nitride.

As shown in FIG. 2, in some embodiments, the control gate CG may be disposed on the dielectric stack 200. In some embodiments, the control gate CG is blanketly disposed on the dielectric stack 200, and the control gate CG is disposed in the active region AA and the peripheral region PA. In some embodiments, the control gate CG fills the gap between adjacent floating gates FG. In some embodiments, the material and formation method of the control gate CG may be the same as or different from the material and the formation method of the floating gate FG. For example, the control gate CG may be polycrystalline silicon. Therefore, the control gate CG of the present disclosure may control the floating gate FG, so the stacked structure of the floating gate FG, the dielectric stack 200, and the control gate CG may be used as a non-volatile memory.

As shown in FIG. 2, in some embodiments, a protective layer 300 may be disposed on the control gate CG. In some embodiments, the protective layer 300 may protect components under the protective layer 300 (such as, the control gate CG) from being damaged by the etching process, or the protective layer 300 may serve as a hard mask for memory cells. In some embodiments, the protective layer 300 may be blanketly disposed on the control gate CG, and the protective layer 300 may be disposed in the active region AA and the peripheral region PA. In some embodiments, the material and formation method of the protective layer 300 may be the same as or different from the material and formation method of the dielectric stack 200. For example, the protective layer 300 may be silicon oxide. In some embodiments, the protective layer 300 may have a first thickness t1 in the third direction D3.

In some embodiments, the capping layer 400 may be disposed on the protective layer 300. In some embodiments, the capping layer 400 may serve as an etch mask and/or an etch stop layer for the protective layer 300. In some embodiments, the capping layer 400 may be disposed in the active region AA and the peripheral region PA. In some embodiments, the material and formation method of the capping layer 400 may be the same as or different from the material and formation method of the dielectric stack 200. For example, the capping layer 400 may be silicon nitride. In some embodiments, the capping layer 400 may have a second thickness t2 in the third direction D3.

In some embodiments, the ratio of the first thickness t1 of the protective layer 300 to the second thickness t2 of the capping layer 400 is 1:0.2-0.5. In other words, the second thickness t2 may be 20% to 50% of the first thickness t1. For example, the second thickness t2 may be 20%, 25%, 30%, 35%, 40%, 45%, 50%, or any value or range of values within the aforementioned range of the first thickness t1, but the present disclosure is not limited thereto. In some embodiments, if the second thickness t2 is less than 20% of the first thickness t1, the capping layer 400 may be too thin, and thus the capping layer 400 may be damaged during the etch process to serve as an etch mask and/or etch stop layer. In some embodiments, if the second thickness t2 is greater than 50% of the first thickness t1, the capping layer 400 may be too thick, so that the capping layer 400 will affect the overall electrical performance of the semiconductor structure, or other processes for forming the semiconductor structure need to be significantly modified corresponding to the excessive thickness of the capping layer 400.

Since the capping layer 400 and the protective layer 300 may have different etching selectivity, the capping layer 400 may serve as an etching mask and/or an etching stop layer for the protective layer 300. In some embodiments, the etch rate of the capping layer 400 may be lower than the etch rate of the protective layer 300, the control gate CG and/or the dielectric stack 200 in an etching process using a specific etchant. For example, the ratio of the etching rate of the capping layer 400 to the etching rate of the protective layer 300 may be 1:2-1:10. Therefore, the present disclosure adjusts the shapes of the protective layer 300, the control gate CG and/or the dielectric stack 200 by disposing the capping layer 400. Therefore, the present disclosure may avoid the limitation of adjusting the remaining process steps corresponding to the thickness of the protective layer 300 without increasing the thickness of the protective layer 300. Accordingly, the present disclosure adjusts the location and shape of the protective layer 300 by disposing the protective layer 300 and the capping layer 400, thereby improving the reliability of the semiconductor structure.

As shown in FIG. 2, a first photoresist layer PR1 may be disposed on the capping layer 400 to pattern the capping layer 400. In some embodiments, the first photoresist layer PR1 may expose a portion of the capping layer 400 in the active region AA. Afterwards, an etching process is performed to remove a portion of the capping layer 400 in the active region AA to obtain a patterned capping layer 400.

Referring to FIG. 3, it is a schematic cross-sectional view illustrating the formation of semiconductor structure in various stages according to some embodiments of the present disclosure. As shown in FIG. 3, the capping layer 400 may expose a portion of the protective layer 300 in the active region AA. For example, the capping layer 400 may expose a first surface 301 of the protective layer 300. In some embodiments, a second photoresist layer PR2 may be further disposed on the protective layer 300 and the capping layer 400, and the second photoresist layer PR2 may cover the first surface 301 of the protective layer 300. Meanwhile, the second photoresist layer PR2 may expose a portion of the capping layer 400 in the peripheral region PA. Next, in some embodiments, a first etching process S3 is performed to remove the capping layer 400 and the protective layer 300 located in the peripheral region PA, thereby exposing the control gate CG. Next, a removal process such as an ashing process is performed to remove the second photoresist layer PR2.

Figure 4:
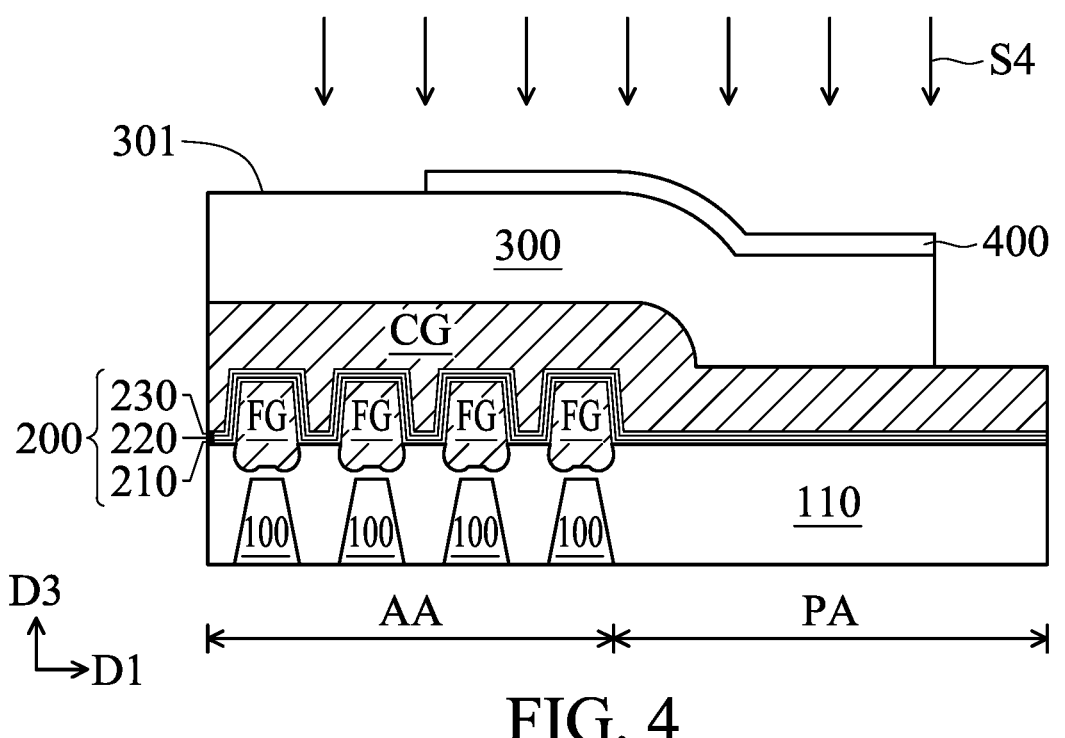
Figure 5:
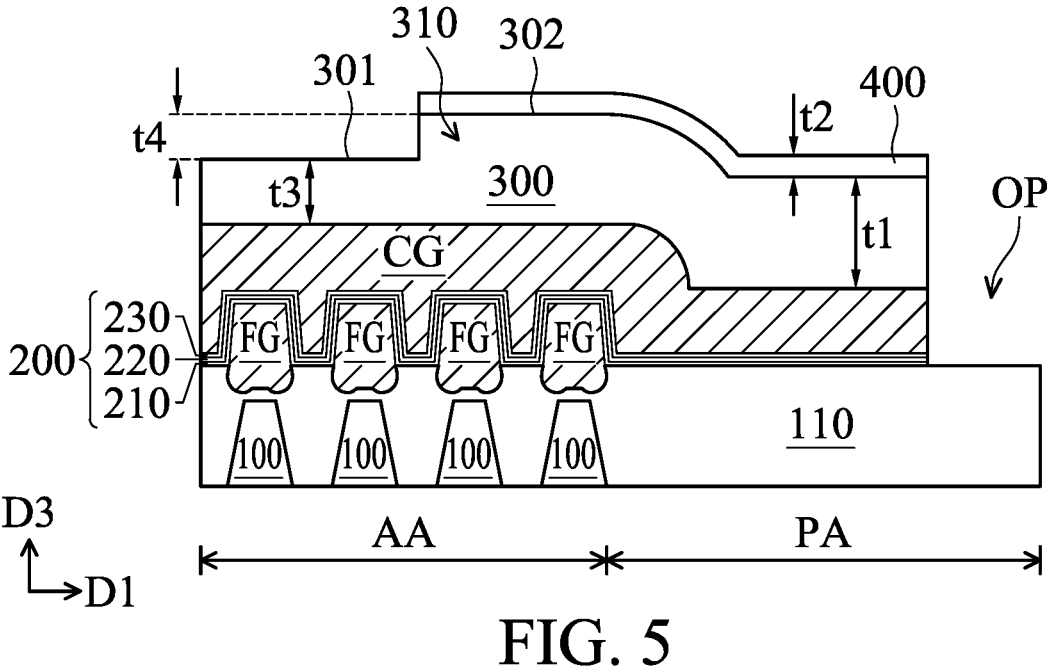

Referring to FIG. 4, it is a schematic cross-sectional view illustrating the formation of semiconductor structure in various stages according to some embodiments of the present disclosure. As shown in FIG. 4, in some embodiments, a second etching process S4 is performed to remove the control gate CG and the dielectric stack 200 located in the peripheral region PA and remove the protective layer 300 located in the active region AA, so as to form the opening OP (as shown in FIG. 5). In some embodiments, the second etching process S4 is the etching process used for patterning of the control gate CG, so the patterned control gate CG is obtained by performing the second etching process S4. In some embodiments, during the second etching process S4, due to the difference in etching selectivity, the capping layer 400 may not be substantially removed while forming the opening OP. Meanwhile, the protective layer 300 exposed by the capping layer 400 may partially remain on the control gate CG even though the protective layer 300 is thinned. As shown in FIG. 4, since the capping layer 400 may extend from the active region AA to the peripheral region PA, the protective layer 300 may correspondingly extend from the active region AA to the peripheral region PA. In some embodiments, the protective layer 300 may cover the control gate CG between the active region AA and the peripheral region PA. In some embodiments, the capping layer 400 may be continuously disposed on the protective layer 300 such that the protective layer 300 may be continuously disposed on the control gate CG.

Accordingly, during the second etching process S4 for patterning the control gate CG, the protective layer 300 may protect the remaining control gate CG from being damaged by the second etching process S4. For example, in some embodiments, when the second etching process S4 is a plasma etching process, the protective layer 300 may protect the control gate CG from being affected by the plasma in the plasma etching process. Furthermore, the protective layer 300 may avoid the implantation of the plasma into the control gate CG which may cause the charge imbalance of the control gate CG, so that the problem of leakage current between the control gate CG and the floating gate FG may be prevented. Therefore, the protective layer 300 of the present disclosure may improve the reliability of the semiconductor structure.

Referring to FIG. 5, it is a schematic cross-sectional view illustrating the formation of semiconductor structure in various stages according to some embodiments of the present disclosure. As shown in FIG. 5, in some embodiments, after performing the second etching process S4, the capping layer 400 may remain on the protective layer 300, and the protective layer 300 in the active region AA may have a stepped portion 310. In detail, since the protective layer 300 below the capping layer 400 is shielded by the capping layer 400 and will not be damaged by the second etching process S4, the protective layer 300 below the capping layer 400 is remained. However, the second etching process S4 has removed at least a portion of the protective layer 300 exposed by the capping layer 400. Thus, the protective layer 300 located in the active region AA may have the stepped portion 310. In other words, the thickness of a portion of the protective layer 300 located in the active region AA may be greater than the thickness of another portion of the protective layer 300 located in the active region AA.

In the third direction D3, the protective layer 300 covered by the capping layer 400 may maintain the first thickness t1, while the protective layer 300 exposed by the capping layer 400 is thinned to have a third thickness t3. In some embodiments, the ratio of the third thickness t3 to the first thickness t1 is 0.5-0.7:1. In other words, the third thickness t3 may be 50% to 70% of the first thickness t1. The third thickness t3 may be 50%, 55%, 60%, 65%, 70%, any value or range of values within the aforementioned ranges of the first thickness t1, but the present disclosure is not limited thereto. In some embodiments, the capping layer 400 partially covers the protective layer 300 located in the active region AA, and the capping layer 400 completely covers the protective layer 300 located in the peripheral region PA, so the thickness of the protective layer 300 located in the active region AA may be less than or equal to the first thickness t1 of the protective layer 300 located in the peripheral region PA.

In the third direction D3, the stepped portion 310 may have a fourth thickness t4. The fourth thickness t4 of the stepped portion 310 may also serve as a step difference between the first surface 301 and the second surface 302 of the stepped portion 310. In some embodiments, the ratio of the third thickness t3 to the fourth thickness t4 may be 0.5-0.7:0.3-0.5. In some embodiments, by adjusting the first thickness t1 of the protective layer 300 and the second thickness t2 of the capping layer 400, the present disclosure may expose the isolation structure 110 in the peripheral region PA, and pattern the control gate CG to form the opening OP. Thus, the protective layer 300 covers the remaining control gate CG. Therefore, the protective layer 300 may protect the control gate CG from being damaged by further processes (such as an etching process) when other further processes are subsequently performed.

As shown in FIG. 5, in some embodiments, the opening OP may be used to electrically isolate components located in the active region AA from components located in the peripheral region PA. In some embodiments, an insulating layer (not shown), a filling layer (not shown), or another suitable layer may be further formed in the opening OP. In some other embodiments, after performing the second etching process S4, the capping layer 400 may be at least partially removed, or the capping layer 400 may be thinned. In some embodiments, during or after performing the second etching process S4, the capping layer 400 is completely removed.

Figure 6:
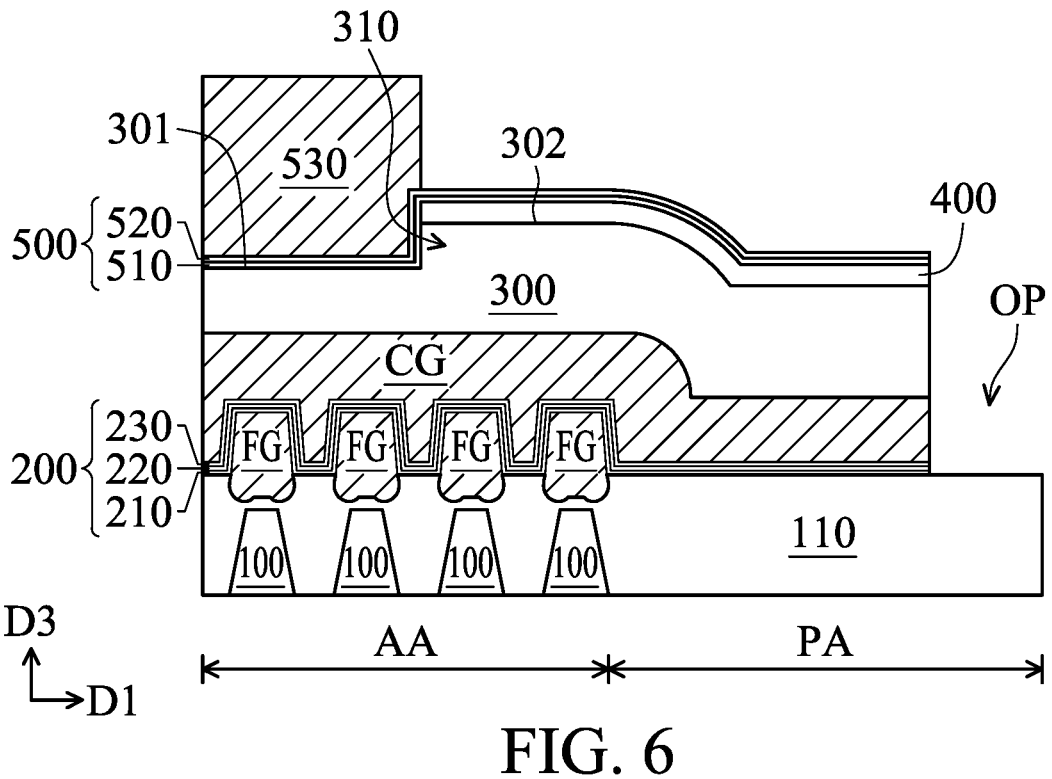

Referring to FIG. 6, it is a schematic cross-sectional view illustrating the formation of semiconductor structure in various stages according to some embodiments of the present disclosure. As shown in FIG. 6, in some embodiments, a liner 500 is formed on the protective layer 300 and the capping layer 400, the material and formation method of the liner 500 may be the same as or different from the material and formation method of the dielectric stack 200. In some embodiments, the liner 500 may be conformally disposed on the stepped portion 310 of the protective layer 300, the liner 500 may cover the first surface 301 of the protective layer 300. In some embodiments, the liner 500 may include a first liner 510 and a second liner 520, the first liner 510 may be conformally disposed on the protective layer 300 and the capping layer 400, and the second liner 520 may be disposed on the first liner 510. For example, the first liner 510 may be oxide, and the second liner 520 may be nitride. As shown in FIG. 6, in some embodiments, a sacrificial layer 530 may be disposed on the liner 500, and the sacrificial layer 530 may include polycrystalline silicon.

Figure 7:
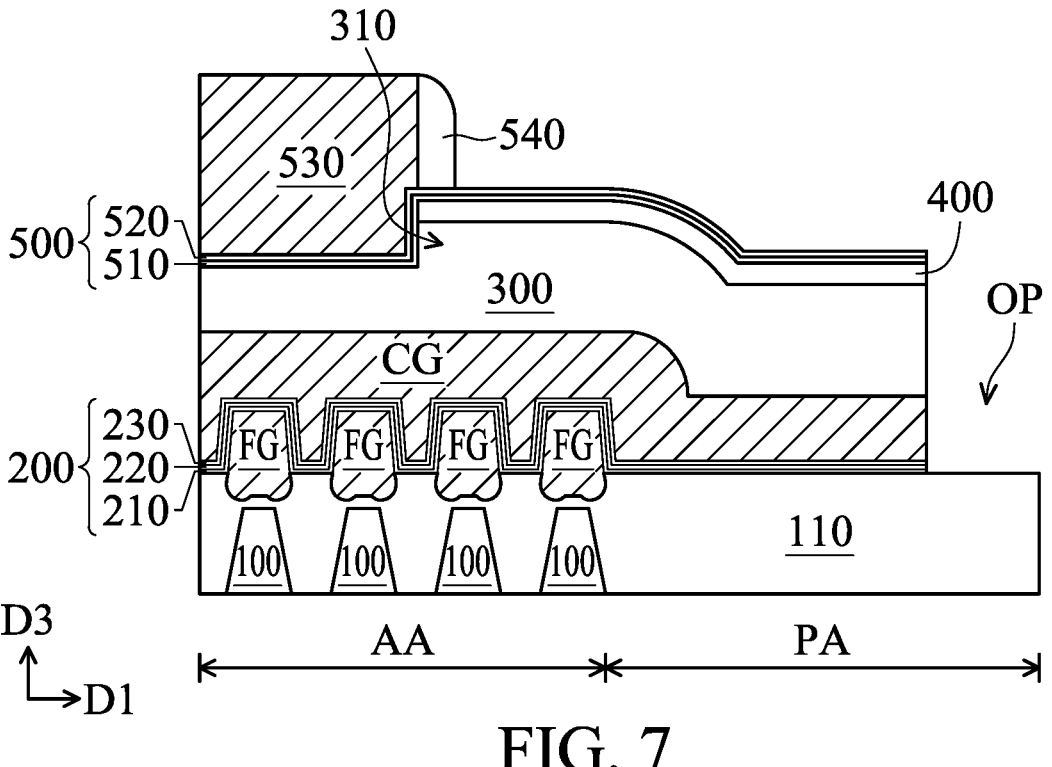

Referring to FIG. 7, it is a schematic cross-sectional view illustrating the formation of semiconductor structure in various stages according to some embodiments of the present disclosure. As shown in FIG. 7, in some embodiments, a spacer 540 may be disposed on the liner 500, and the spacer 540 may be disposed on the side surface of the sacrificial layer 530. In other words, the sacrificial layer 530 may serve as a template for the spacer 540 to form the spacer 540. In detail, the material of the spacer 540 may be conformally formed on the sacrificial layer 530 and the liner 500, and then an etching process is performed to expose the top surface of the sacrificial layer 530 and form the spacer 540 on the side surface of the sacrificial layer 530.

Figure 8:
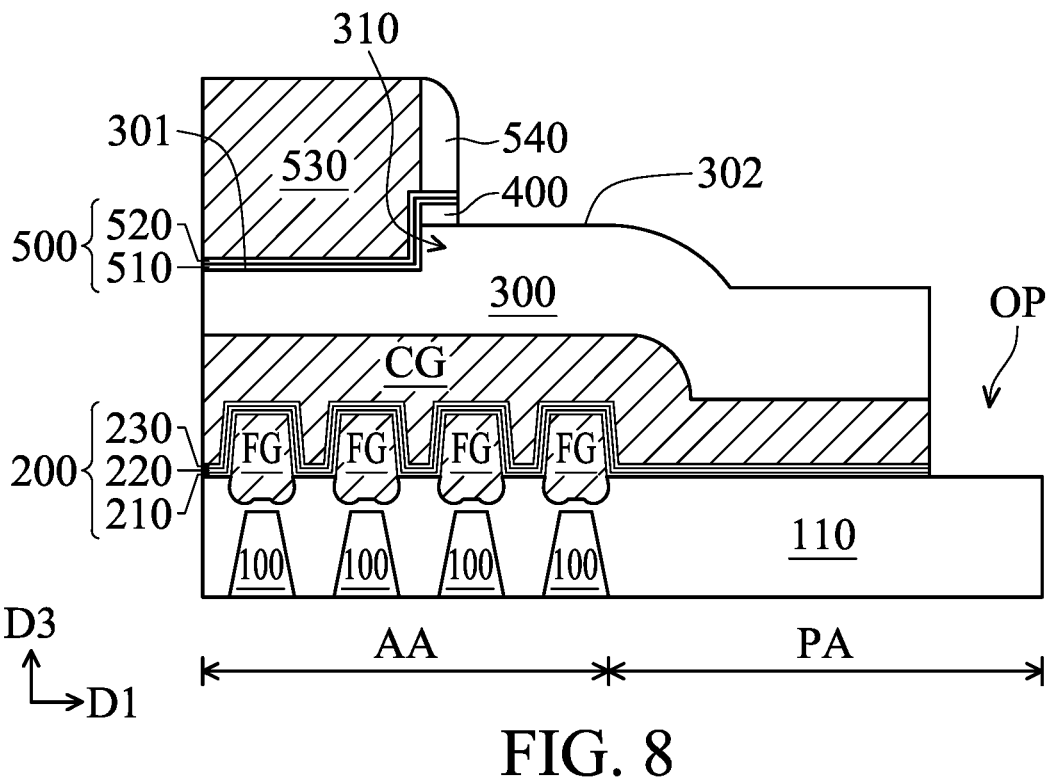

Referring to FIG. 8, it is a schematic cross-sectional view illustrating the formation of semiconductor structure in various stages according to some embodiments of the present disclosure. As shown in FIG. 8, in some embodiments, by using the sacrificial layer 530 and the spacer 540 as an etching mask, an etching process is performed to remove a portion of the liner 500 and a portion of the capping layer 400, thereby exposing the second surface 302 of the protective layer 300. In addition, after performing the etching process, the liner 500 and the capping layer 400 under the sacrificial layer 530 and the spacer 540 may be remained. In some embodiments, the spacer 540 and the capping layer 400 may be disposed on the second surface 302 of the protective layer 300. In some embodiments, the liner 500 may be disposed on the first surface 301 and the second surface 302 of the protective layer 300.

Figure 9:
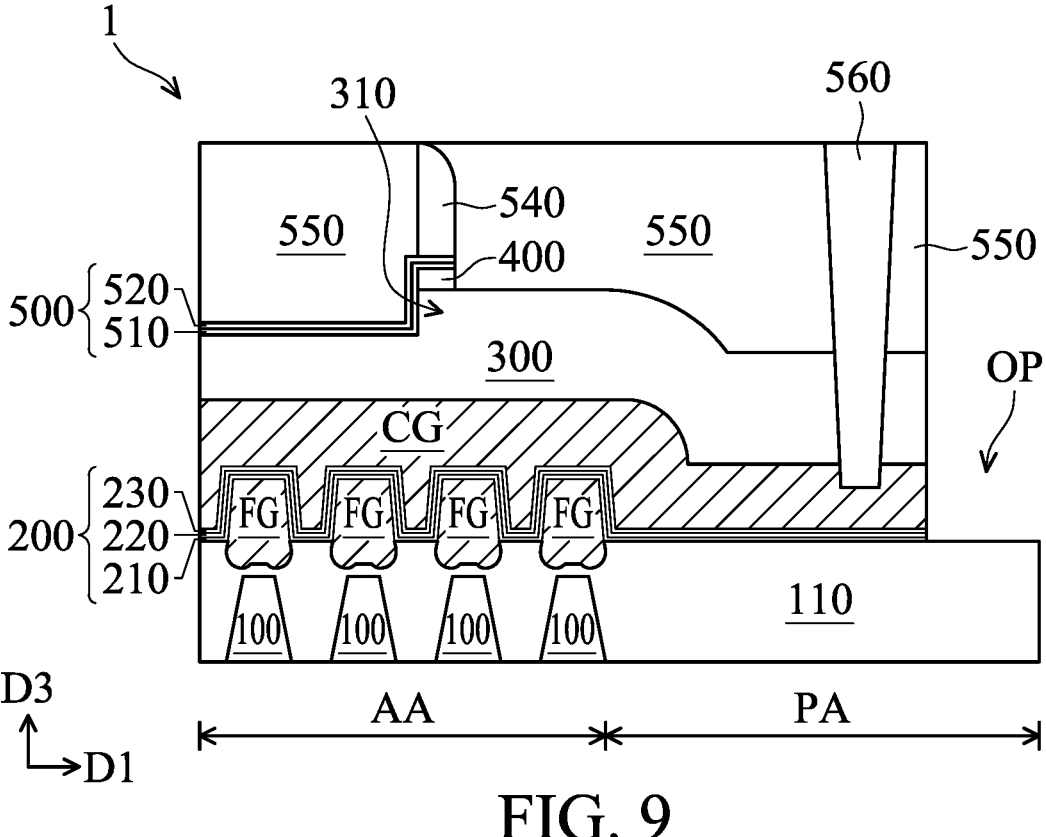

Referring to FIG. 9, it is a schematic cross-sectional view illustrating the formation of semiconductor structure 1 in various stages according to some embodiments of the present disclosure. As shown in FIG. 9, in some embodiments, the sacrificial layer 530 may be removed and the spacer 540 may be remained. Next, a planarization layer 550 is formed on the liner 500, the spacer 540, and the protective layer 300. In some embodiments, the material and formation method of the planarization layer 550 may be the same as or different from the material and formation method of the dielectric stack 200. For example, the planarization layer 550 may be silicon oxide. In some embodiments, the bottom surface of the spacer 540 may be higher than the bottom surface of the planarization layer 550 in the active region AA. Following the above, a contact plug 560 is formed in the peripheral region PA to obtain the semiconductor structure 1.

In some embodiments, the contact plug 560 may pass through (penetrate) the planarization layer 550 and the protective layer 300, and the contact plug 560 may extend to the control gate CG. Therefore, the contact plug 560 may be electrically connected the control gate CG, so that the contact plug 560 may control the control gate CG. The contact plug 560 may include or may be metal, metal nitride, conductive metal oxide, other suitable materials, or a combination thereof, but the present disclosure is not limited thereto.

As shown in FIG. 9, in some embodiments, the capping layer 400 is disposed between the protective layer 300 and the liner 500, and the capping layer 400 is disposed under the spacer 540. Since the etching rates of the spacer 540 and the capping layer 400 may be different, the spacer 540 and the capping layer 400 may respectively resist different types of etchant. In other words, the spacer 540 and the capping layer 400 may be integrally regarded as a spacer including multiple layers of materials. Thus, the spacers including multiple layers of materials may electrically isolate the floating gate FG and the control gate CG during the various etching processes using different etchants. Therefore, the capping layer 400 may improve the reliability of the semiconductor structure 1 and improve the process margin of the formation method.

Figure 10:
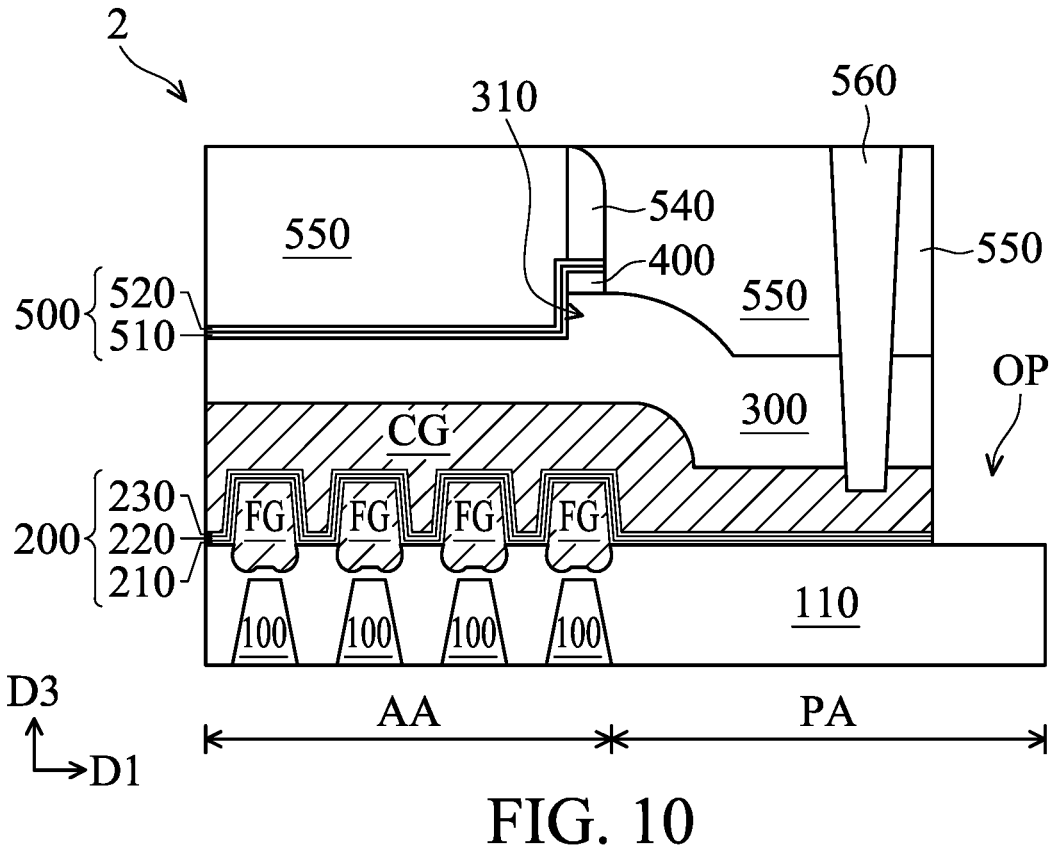
FIG. 10 is a schematic cross-sectional view illustrating a semiconductor structure according to other embodiments of the present disclosure.

Referring to FIG. 10, it is a schematic cross-sectional view illustrating a semiconductor structure 2 according to other embodiments of the present disclosure. The same as or similar components of the semiconductor structure 2 and the semiconductor structure 1 will not be described in detail. In some embodiments, as shown in FIG. 10, the stepped portion 310 of the protective layer 300 may be located above the floating gate FG closest to the peripheral region PA, so that the stepped portion 310 of the protective layer 300 protects the floating gate FG from being damaged by the etching process. Thus, the leakage current may be prevented.

In summary, the semiconductor structure and the method of forming the same of the present disclosure include the protective layer with the stepped portion, so the protective layer may be disposed to block the implantation of the plasma into control gate during the etching process. Thus, the leakage current occurred by the damage of the control gate may be avoided. Therefore, the reliability of the semiconductor structure be increased. Furthermore, the semiconductor structure of the present disclosure provides spacers of multi-layer materials, so as to effectively protect the control gate and the floating gate.

the plasma implantation control gate in the etching process, thereby preventing the control gate from being damaged resulting in leakage current. Therefore, the reliability of the semiconductor structure can be increased. Furthermore, the semiconductor structure of the present disclosure provides spacers of multi-layer materials, so as to effectively protect the control gate and the floating gate.

The foregoing outlines features of several embodiments so that a person of ordinary skills in the art may better understand the aspects of the present disclosure. A person of ordinary skills in the art should appreciate that they may readily use the present disclosure as a basis for changing, replacing, substituting, or modifying other processes and structures for carrying out the same purposes and/or achieving the same advantages of the embodiments introduced herein.

What is claimed is:

1. A semiconductor structure, comprising:
   a substrate comprising an active region and a peripheral region;
   a floating gate disposed on the substrate;
   a dielectric stack disposed on the floating gate;
   a control gate disposed on the dielectric stack; and
   a protective layer disposed on the control gate,
   wherein the protective layer located in the active region has a stepped portion.

2. The semiconductor structure as claimed in claim 1, wherein a thickness of the protective layer located in the active region is less than a thickness of the protective layer located in the peripheral region.

3. The semiconductor structure as claimed in claim 2, wherein the thickness of the protective layer located in the active region is 50% to 70% of the thickness of the protective layer located in the peripheral region.

4. The semiconductor structure as claimed in claim 1, further comprising:

a liner disposed on the stepped portion of the protective layer;

a planarization layer disposed on the liner; and a spacer disposed on the liner, and wherein a bottom surface of the spacer is higher than a bottom surface of the planarization layer.

5. The semiconductor structure as claimed in claim 4, further comprising:

a capping layer disposed between the protective layer and the liner and located under the spacer.

6. The semiconductor structure as claimed in claim 5, wherein a thickness of the capping layer is 20% to 50% of a thickness of the protective layer located in the peripheral region.

7. The semiconductor structure as claimed in claim 5, wherein the protective layer is silicon oxide, and the capping layer is silicon nitride.

8. The semiconductor structure as claimed in claim 4, further comprising:

a contact plug disposed in the peripheral region, wherein the contact plug passes through the planarization layer and the protective layer so as to electrically connect to the control gate.

9. The semiconductor structure as claimed in claim 1, wherein a bottom surface of the floating gate is wavy.

10. The semiconductor structure as claimed in claim 1, further comprising:

an isolation structure disposed in the substrate, wherein a top surface of the floating gate is higher than a top surface of the isolation structure.

11. A method of forming a semiconductor structure, comprising:

forming a floating gate on a substrate, wherein the substrate comprises an active region and a peripheral region;

forming a dielectric stack on the floating gate;

forming a control gate on the dielectric stack;

forming a protective layer on the control gate;

forming a capping layer on the protective layer; and performing an etching process by using the capping layer as an etching mask, so that the protective layer located in the active region has a stepped portion.

12. The method as claimed in claim 11, wherein performing the etching process further comprises:

performing a first etching process to remove the capping layer and the protective layer in the peripheral region; and performing a second etching process to remove the control gate and the dielectric stack in the peripheral region and the protective layer in the active region.

13. The method as claimed in claim 12, wherein performing the etching process further comprises:

before performing the first etching process, forming a first photoresist layer on the protective layer and the capping layer.

14. The method as claimed in claim 11, wherein a ratio of an etching rate of the capping layer to an etching rate of the protective layer is 1:2-1:10.

15. The method as claimed in claim 11, wherein the formation of the capping layer on the protective layer further comprises:

patterning the capping layer so that the capping layer exposes the protective layer in the active region.

16. The method as claimed in claim 15, wherein the formation of the capping layer on the protective layer further comprises:

forming a second photoresist layer on the capping layer, wherein the second photoresist layer exposes a portion of the capping layer in the active region; and performing a third etching process to remove the portion of the capping layer in the active region and exposes the protective layer in the active region.

17. The method as claimed in claim 11, wherein performing the etching process further comprises:

forming a liner on the protective layer and the capping layer;

forming a sacrificial layer on the liner;

forming a spacer on the liner;

removing the liner and the capping layer to expose the protective layer;

removing the sacrificial layer;

forming a planarization layer on the liner, the spacer, and the protective layer; and forming a contact plug in the peripheral region, wherein the contact plug passes through the planarization layer and the protective layer so as to electrically connect to the control gate.

18. The method as claimed in claim 17, wherein the formation of the liner further comprises:

forming a first liner on the protective layer and the capping layer; and forming a second liner on the first liner.

19. The method as claimed in claim 18, wherein the first liner is oxide, and the second liner is nitride.

20. The method as claimed in claim 17, wherein the sacrificial layer is polycrystalline silicon.

* * * * *